(12) United States Patent
Akiyama

(10) Patent No.: US 9,002,147 B2
(45) Date of Patent: Apr. 7, 2015

(54) OPTICAL SEMICONDUCTOR DEVICE

(71) Applicant: Fujitsu Limited, Kawasaki-shi, Kanagawa (JP)

(72) Inventor: Tomoyuki Akiyama, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/474,987

(22) Filed: Sep. 2, 2014

(65) Prior Publication Data
US 2015/0016767 A1 Jan. 15, 2015

Related U.S. Application Data

(63) Continuation of application No. PCT/JP2012/058263, filed on Mar. 28, 2012.

(51) Int. Cl.
*G02B 6/42* (2006.01)
*G02B 6/26* (2006.01)
*G02F 1/225* (2006.01)
*G02F 1/21* (2006.01)

(52) U.S. Cl.
CPC .......... *G02F 1/225* (2013.01); *G02F 2001/212* (2013.01)

(58) Field of Classification Search
USPC .............................. 385/10, 32, 1–3
See application file for complete search history.

(56) References Cited

U.S. PATENT DOCUMENTS

| 2006/0078010 | A1* | 4/2006  | Kim et al. ..................... 372/18 |
| 2006/0222038 | A1  | 10/2006 | Yamazaki |
| 2008/0056313 | A1  | 3/2008  | Yamazaki |
| 2008/0199128 | A1  | 8/2008  | Tanaka et al. |
| 2009/0285251 | A1  | 11/2009 | Yamazaki |
| 2009/0290835 | A1* | 11/2009 | Popovic ..................... 385/32 |
| 2011/0013654 | A1* | 1/2011  | Yamazaki ................. 372/29.02 |
| 2012/0093455 | A1* | 4/2012  | Yi et al. ..................... 385/10 |
| 2012/0207425 | A1  | 8/2012  | Kondou |

FOREIGN PATENT DOCUMENTS

| JP | 2003-066253 | 3/2003 |
| JP | 2006-278769 | 10/2006 |
| JP | 2008-060326 | 3/2008 |
| JP | 2008-066318 | 3/2008 |

(Continued)

OTHER PUBLICATIONS

Seok-Hwan Jeong et al., "Hybrid Laser with Si Ring Resonator and SOA for Temperature Control Free Operation with Ring Resonator-based Modulator", 2011, 8th IEEE International Conference on Group IV Photonics, pp. 172-174.

(Continued)

*Primary Examiner* — Eric Wong
(74) *Attorney, Agent, or Firm* — Fujitsu Patent Center

(57) ABSTRACT

An optical semiconductor device includes a laser oscillator on a semiconductor substrate; and an optical modulator on the semiconductor substrate. The laser oscillator includes a pair of reflecting mirrors at least one of which is a loop mirror, and the loop mirror includes a loop waveguide and a plurality of first ring resonators serially inserted in the loop waveguide. The optical modulator includes a plurality of second ring resonators connected in cascade along a modulator waveguide. A transmission band width of the first ring resonator is set greater than a transmission band width of the second ring resonator.

10 Claims, 18 Drawing Sheets

(56) References Cited

FOREIGN PATENT DOCUMENTS

| | | |
|---|---|---|
| JP | 2008-198944 | 8/2008 |
| JP | 2009-278015 | 11/2009 |
| JP | 2010-027664 | 2/2010 |
| JP | 2011-075906 | 4/2011 |
| JP | 2011-253930 | 12/2011 |
| WO | 2009/119284 | 10/2009 |

OTHER PUBLICATIONS

International Search Report of Int. Appl. No. PCT/JP2012/058263 mailed May 22, 2012.

* cited by examiner

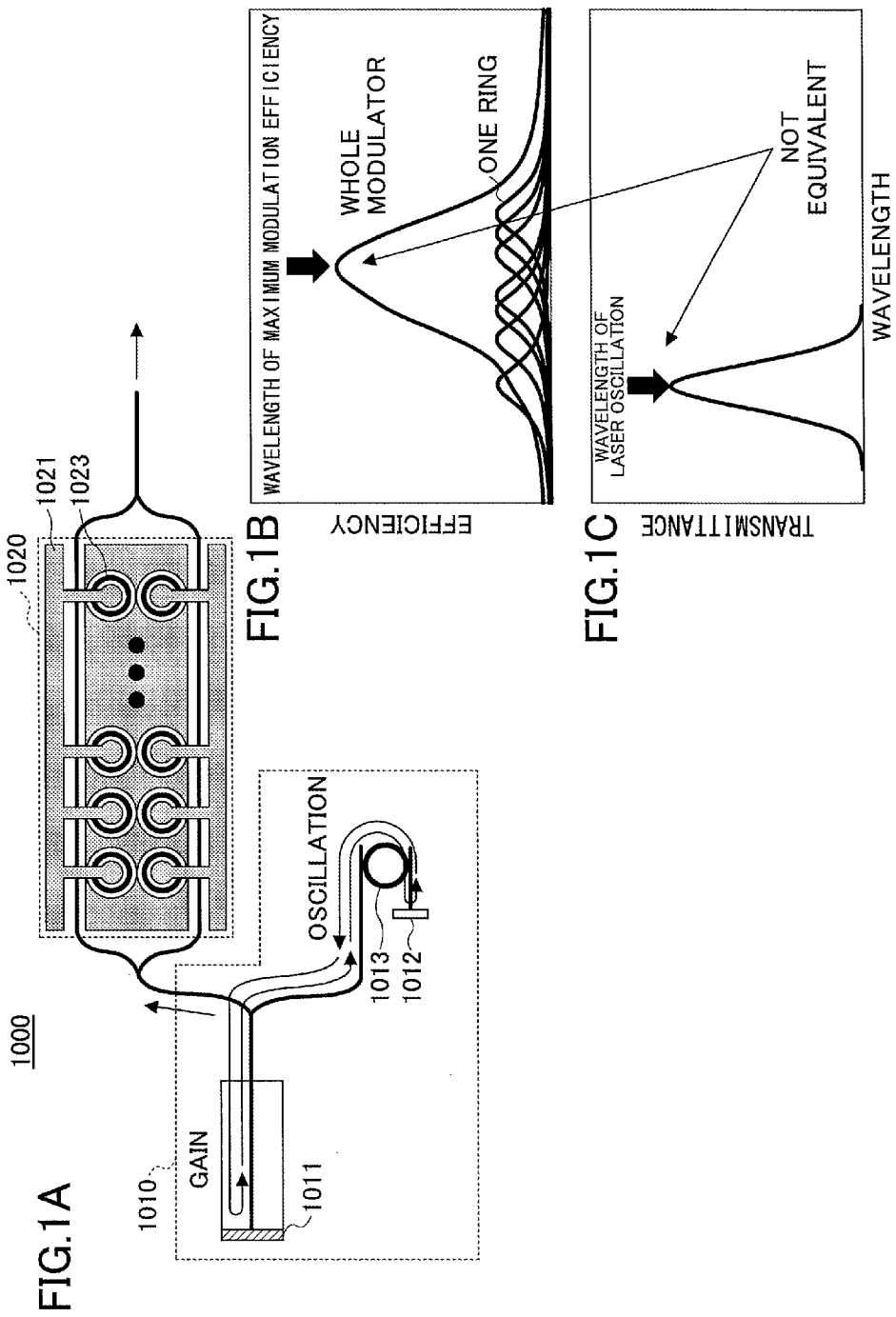

FIG.3A LINEAR PHASE SHIFTER

FIG.3B RING PHASE SHIFTER

LIGHT →

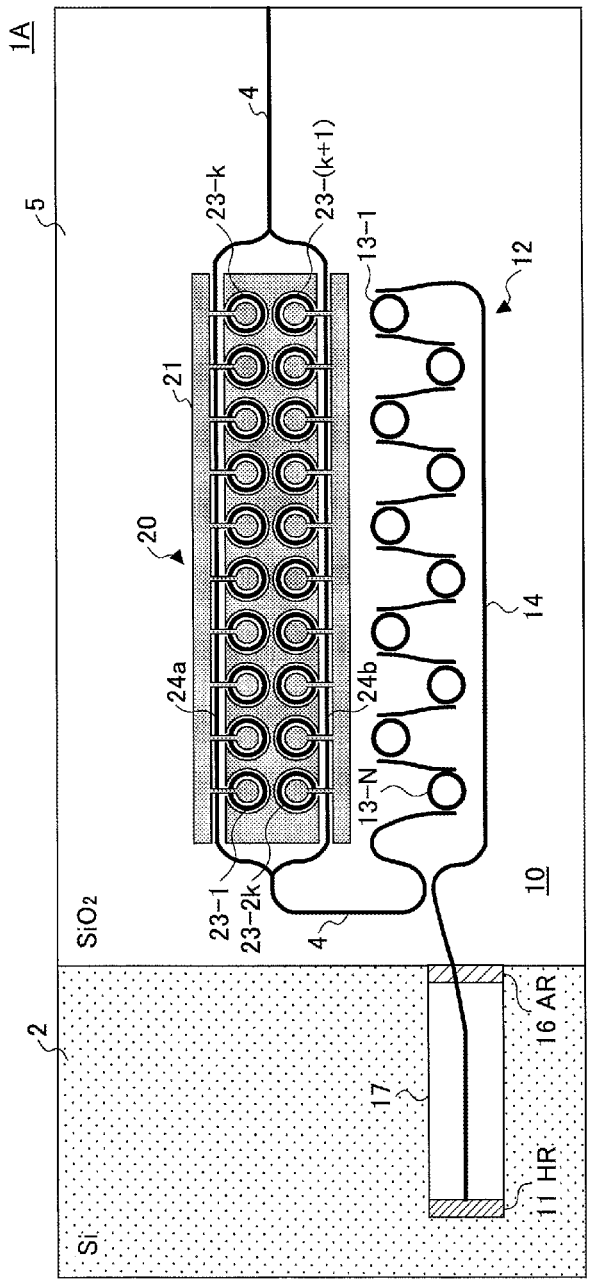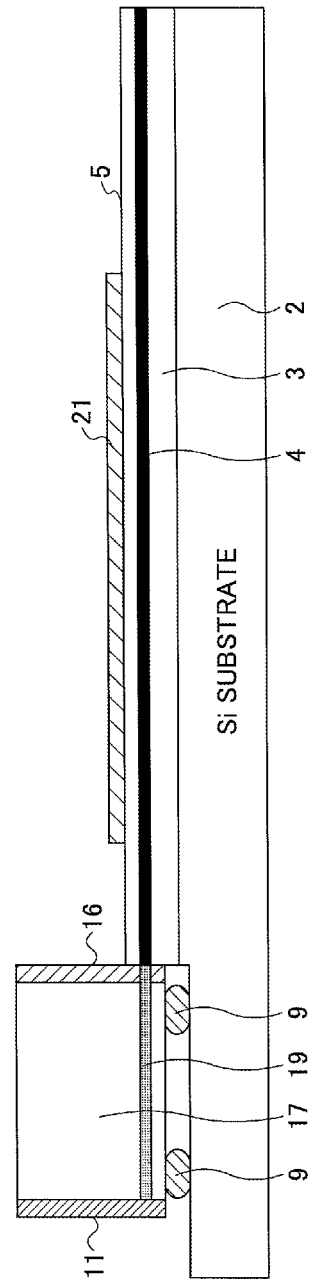
FIG.6A
FIG.6B

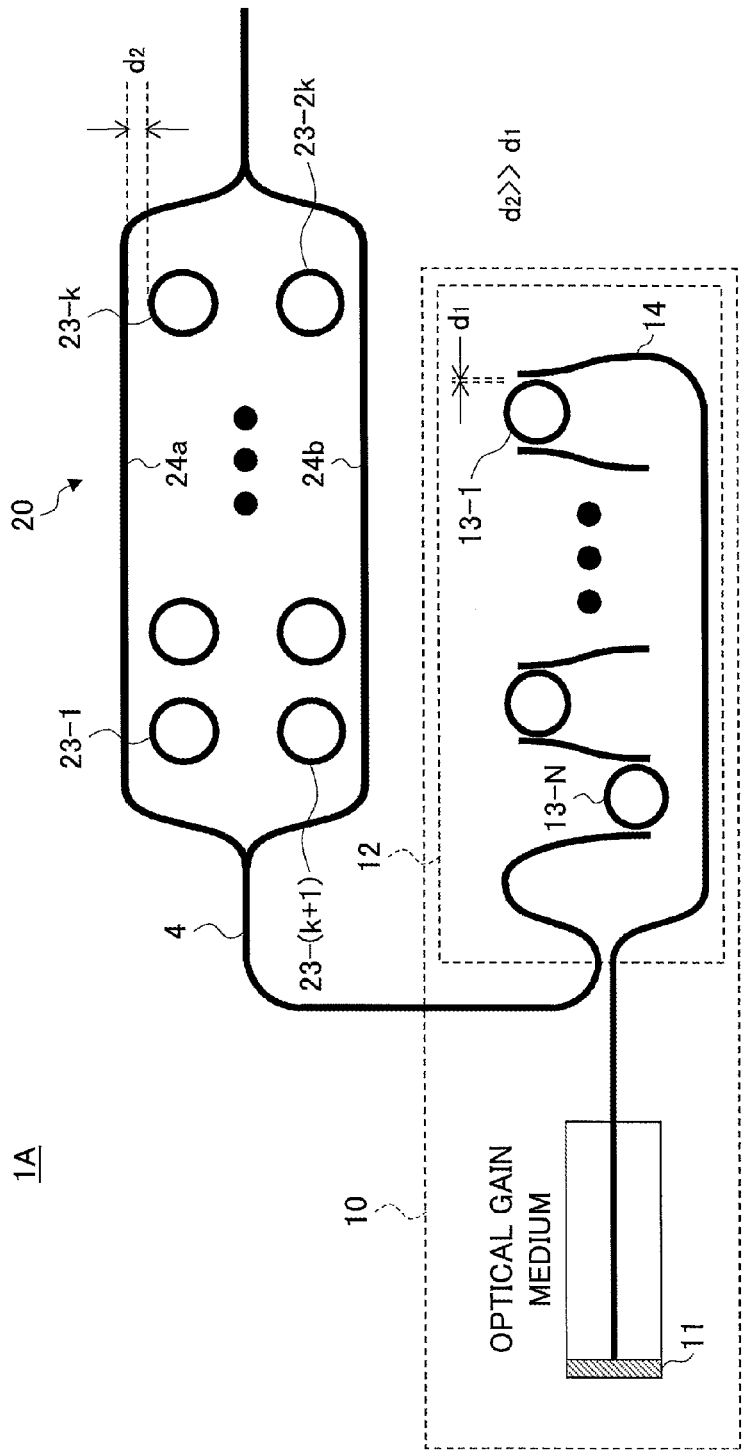

OPTICAL SEMICONDUCTOR DEVICE

CROSS-REFERENCE TO RELATED APPLICATIONS

This application is a continuation application of International Application PCT/JP2012/058263 filed on Mar. 28, 2012 and designated the U.S., the entire contents of which are incorporated herein by reference.

FIELD

The disclosures herein generally relate to an optical semiconductor device.

BACKGROUND

To make a large-capacity optical transceiver have a smaller size and lower power consumption, a technology to monolithically integrate an optical device on a substrate having a silicon waveguide plays an important role. As a configuration that makes the modulation efficiency higher for a modulator on a silicon substrate, and reduces the power consumption and the device size, ring assist (RA) modulators have been proposed (see Non-Patent Document 1, for example). An RA modulator has multiple ring resonators arrayed in a phase shifter to make the effective interaction length greater.

FIGS. 1A-1C are schematic views of a conventional optical semiconductor device 1000. The optical semiconductor device 1000 has a laser oscillator 1010 and a ring-assist-type Mach-Zehnder (MZ) modulator 1020 integrated on a not-illustrated silicon substrate. The laser oscillator 1010 includes two mirrors 1011 and 1012 facing each other and a ring resonator 1013. By inserting the ring resonator 1013, a filter characteristic is obtained that transmits wavelengths only in the neighborhood of the ring resonance wavelength as illustrated in FIG. 1C to execute laser oscillation that centers around the ring resonance wavelength. By making the shape and size of the ring resonator 1013 be equivalent to the shape and size of the ring resonator 1023 of the ring-assist-type MZ modulator 1020, the laser oscillation can be executed at a wavelength with which the highest modulation efficiency of the modulator 1020 is obtained.

The ring resonance wavelength may vary due to manufacturing variations even if the size of the ring resonator is designed to have a same value. In case of the ring-assist-type MZ modulator 1020, such variations can be suppressed for the wavelength of the maximum modulation efficiency for the following reason. As illustrated in FIG. 1B, wavelength dependency of the amount of phase shift of the ring-assist-type MZ modulator 1020 is the sum of wavelength dependencies of amounts of phase shift of the individual rings 1023. A wavelength of the maximum modulation efficiency of the ring-assist-type MZ modulator 1020 exists in the neighborhood of an average of resonance wavelengths of the individual ring resonators 1023. Therefore, variations of the wavelength of the maximum modulation efficiency for the whole modulator are suppressed compared to variations of the resonance wavelengths of the ring resonators 1023.

On the other hand, the laser oscillator 1010 has only one ring resonator 1013, and hence, variations of the resonance wavelength of the ring resonator 1013 directly result in variations of the oscillation wavelength. Therefore, a shift is generated between the wavelength of laser oscillation (the graph in FIG. 1C) and the peak wavelength that maximizes the modulation efficiency (the graph in FIG. 1B). This shift reduces the modulation efficiency of the modulator 1020, or generates individual differences of the characteristic.

Note that a variable wavelength laser has been known that uses a loop filter configured with multi-stage waveguide ring resonators (see Patent Document 1, for example).

RELATED-ART DOCUMENTS

Patent Documents

[Patent Document 1] Japanese Laid-open Patent Publication No. 2008-60326

Non-Patent Document

[Non-Patent Document 1] Seok-Hwan Jeong et al., "Hybrid Laser with Si Ring Resonator and SOA for Temperature Control Free Operation with Ring Resonator-based Modulator", 2011 8th IEEE International Conference on Group IV Photonics, pp. 172-174 (2011)

SUMMARY

According to at least an embodiment of the present invention, an optical semiconductor device includes a laser oscillator on a semiconductor substrate; and an optical modulator on the semiconductor substrate. The laser oscillator includes a pair of reflecting mirrors at least one of which is a loop mirror, and the loop mirror includes a loop waveguide and a plurality of first ring resonators serially inserted in the loop waveguide. The optical modulator includes a plurality of second ring resonators connected in cascade along a modulator waveguide. A transmission band width of the first ring resonator is set greater than a transmission band width of the second ring resonator.

The object and advantages of the embodiment will be realized and attained by means of the elements and combinations particularly pointed out in the claims. It is to be understood that both the foregoing general description and the following detailed description are exemplary and explanatory and are not restrictive of the invention as claimed.

BRIEF DESCRIPTION OF DRAWINGS

FIGS. 1A-1C are schematic views of a conventional optical semiconductor device using a ring-assist-type MZ modulator;

FIGS. 3A-3C are diagrams illustrating a characteristic of a ring phase shifter;

FIGS. 6A-6B are diagrams illustrating a whole configuration of an optical semiconductor device according to a first embodiment;

FIG. 7 is a schematic view illustrating an optical semiconductor device according to the first embodiment;

DESCRIPTION OF EMBODIMENTS

In the following, embodiments of the present invention will be described with reference to the drawings.

Figure 2A:
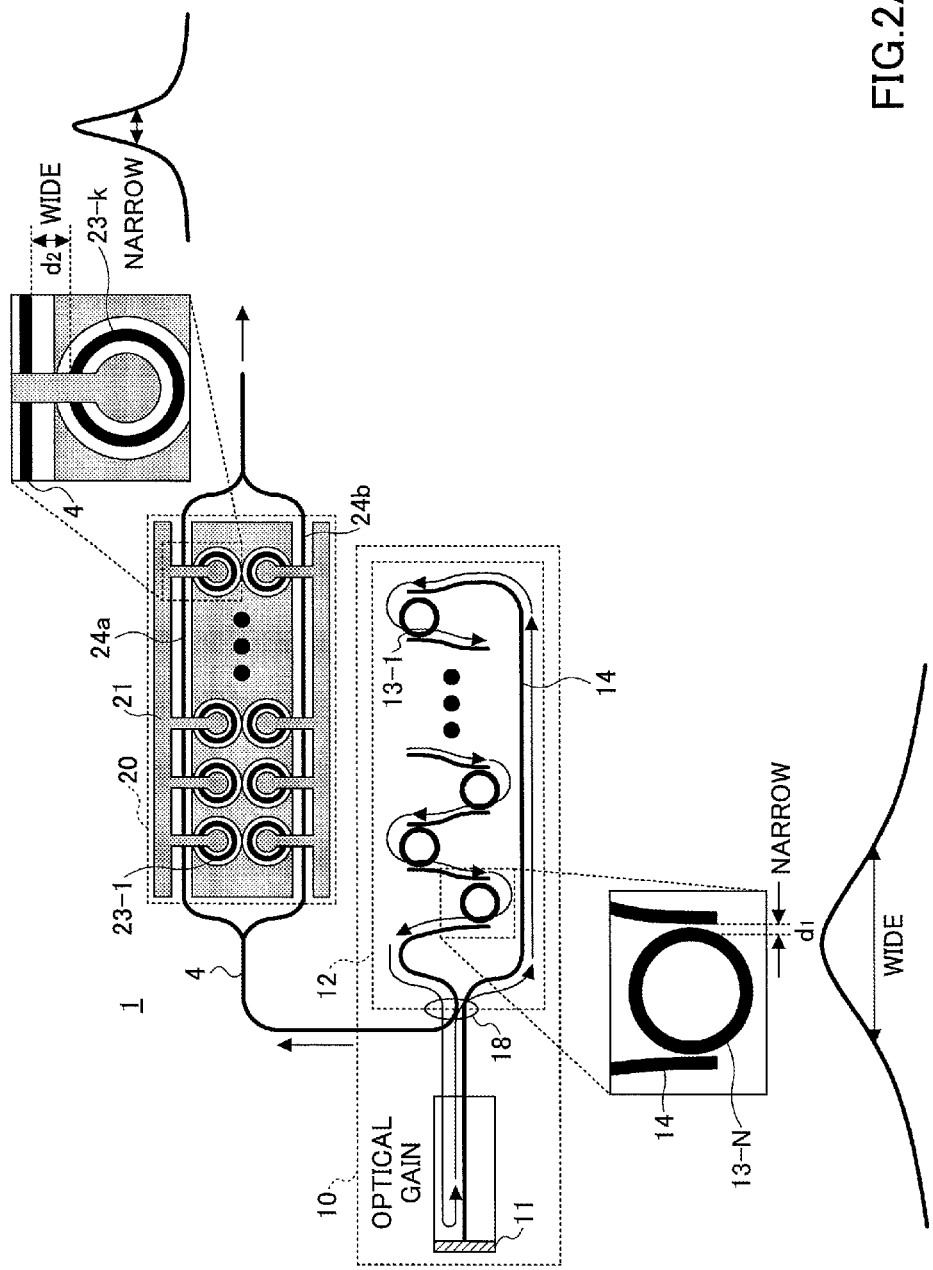
FIG. 2A is a diagram illustrating an optical semiconductor device according to an embodiment of the present invention.
Figure 2B:
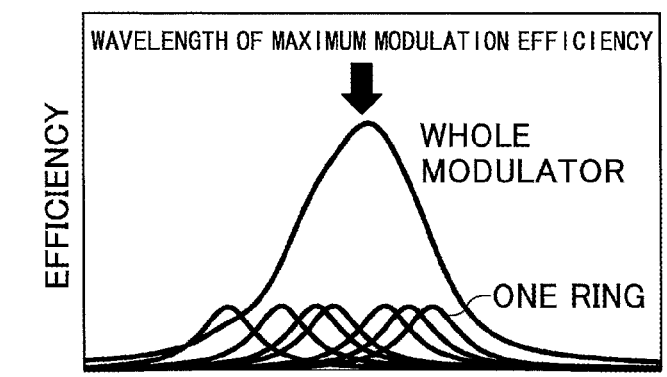
FIGS. 2B-2C are diagrams illustrating a wavelength characteristic of the optical semiconductor device in FIG. 2A.

FIG. 2A is a diagram of an optical semiconductor device 1 according to an embodiment of the present invention, and FIG. 2B is a diagram of a wavelength characteristic of the optical semiconductor device 1 in FIG. 2A.

The optical semiconductor device 1 includes a laser oscillator 10 and an optical modulator 20. The optical modulator 20 includes a first arm 24a and a second arm 24b forming waveguides, multiple ring resonators 23-1 to 23-2k (collectively referred to as the "ring resonators 23" when appropriate) arranged along the first arm 24a and the second arm 24b, and an electrode 21 for applying a voltage.

The laser oscillator 10 includes a reflecting mirror 11 and a loop mirror 12. The loop mirror 12 includes a loop waveguide 14 extending beyond a branch part 18 and multiple ring resonators 13-1 to 13-N (collectively referred to as the "ring resonators 13" when appropriate) optically coupled with the loop waveguide 14 in series. The loop mirror 12 functions as a filter that determines the oscillation wavelength of the laser oscillator 10.

For convenience's sake, the waveguide included in the loop mirror 12 is referred to as the "loop waveguide 14", the waveguides included in the optical modulator 20 is referred to as the "first arm 24a" and the "second arm 24b", and the other parts (a waveguide connecting the reflecting mirror 11 with the loop mirror 12, a waveguide connecting the loop mirror 12 with the optical modulator 20, and a waveguide at the output side of the optical modulator 20) are collectively referred to as "waveguides 4". These are formed by the same process and of the same material.

Figure 2C:
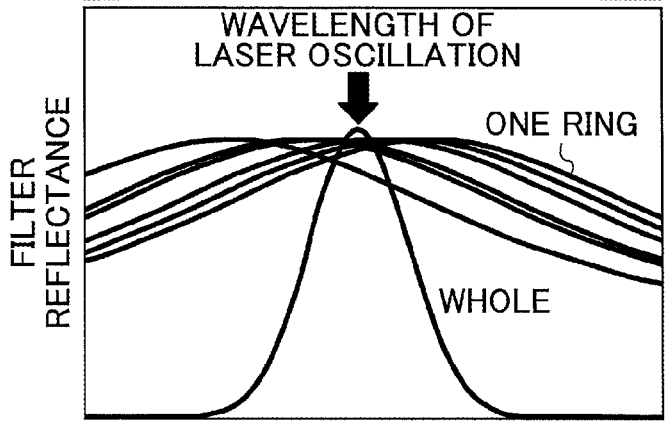

When the ring resonators 13-1 to 13-N are serially connected in the loop mirror 12, the whole transmission spectrum is obtained by multiplying transmission spectrums of the ring resonators 13 as illustrated in FIG. 2C. Even if the transmission spectrums of the ring resonators 13 vary, the transmission peak wavelength of the whole transmission spectrum is positioned in the neighborhood of the average transmission peak wavelength of the individual ring resonators 13. Variations of the resonance wavelength can be reduced compared to a case where a single ring-type resonator is used because the oscillation wavelength of the laser oscillator 10 is determined by the average resonance wavelength of the ring resonators 13-1 to 13-N.

When the ring resonators 13-1 to 13-N are serially connected, the transmittance is reduced while passing through each of the ring resonators 13. To avoid this, the transmission wavelength band of a single ring resonator 13 is broadened. In the configuration in FIG. 2A, a gap width d1 between the loop waveguide 14 of the loop mirror 12 and the ring resonator 13 is set smaller than a gap width d2 between the arm (waveguide) 24a or 24b of the optical modulator 20 and the ring resonator 23. This makes the coupling constant of a directional coupler constituted with the loop waveguide 14 and the ring resonator 13 greater, with which the transmission band can be broadened.

On the other hand, as illustrated in FIG. 2B, the whole modulation efficiency of the optical modulator 20 is the sum of modulation efficiencies (amounts of phase shift per unit voltage) of the ring resonators 23. The peak wavelength at which the whole modulation efficiency takes the maximum is positioned in the neighborhood of the center of variations of the peak wavelength of the modulation efficiency of the ring resonators 23.

As can be seen in FIGS. 2B-2C, by using the loop mirror 12, which is a ring chain of the serially connected ring resonators 13 in the waveguide 14, the wavelength of laser oscillation of the laser oscillator 10 can be set in the neighborhood of the average value of the resonance wavelengths of the ring resonators 13, which is virtually equivalent to the average value of the resonance wavelengths of the ring resonators 23 that determines the wavelength of the maximum modulation efficiency of the optical modulator 20. In the example in FIG. 2A, although only one of the pair of the reflecting mirrors in the laser oscillator 10 is configured with the loop mirror 12, both may be configured with the loop mirrors 12.

Figure 3C:
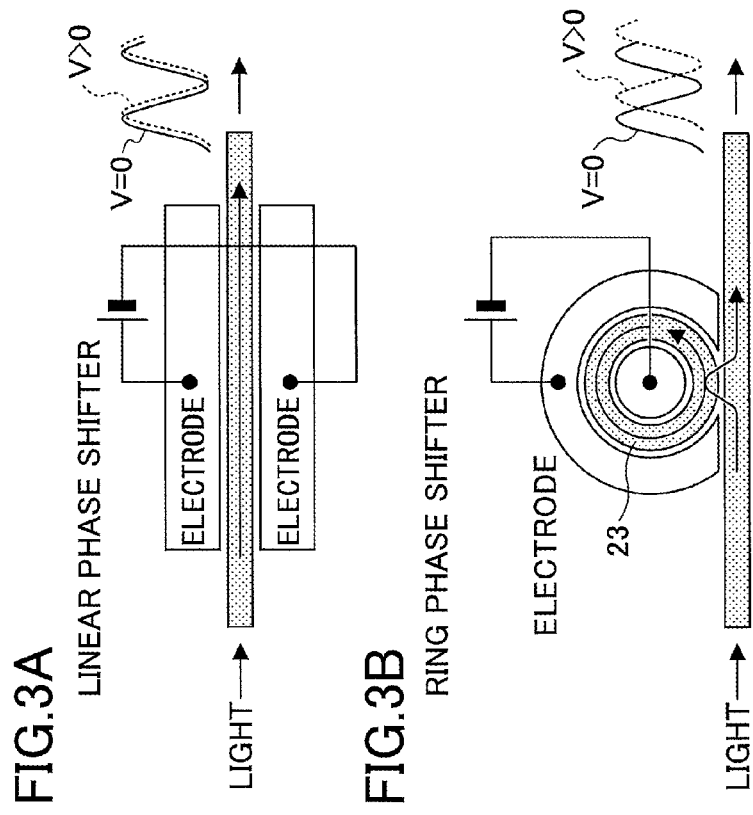

Next, with reference to FIGS. 3A-4B, advantages will be described for using the ring resonators 23 in the optical modulator 20. Compared to a linear phase shifter in FIG. 3A, a ring phase shifter can restrict a wavelength causing a phase shift in the neighborhood of the ring resonance wavelength. Also, the ring phase shifter has a greater amount of phase shift than the linear phase shifter when the same voltage is applied. Therefore, by using the ring resonator 23, the wavelength causing a phase shift can be restricted to specific wavelengths, and the amount of phase shift per unit voltage can be intensified as illustrated in FIG. 3C.

Figure 4A:
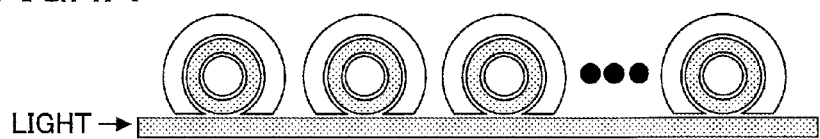
FIGS. 4A-4B are diagrams illustrating a characteristic of a cascaded ring phase shifter.
Figure 4B:
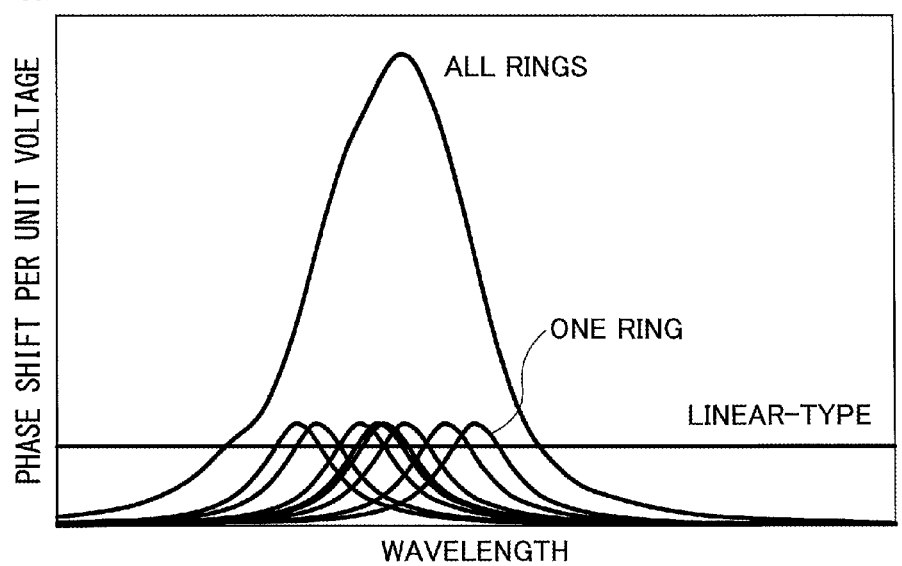

As one ring has a limited optical path length, multiple ring resonators are connected in cascade as illustrated in FIG. 4A to make the optical path length greater. In this case, the phase shift characteristic of the optical modulator 20 is the sum of amounts of phase shift wavelength dependency of the individual ring resonators 23 as illustrated in FIG. 4B. Due to manufacturing variations of the ring resonators 23, the resonance wavelength varies. Consequently, the phase shift band of the optical modulator 20 as a whole is broader than the phase shift band of a ring resonator 23. By placing such a cascaded ring-type phase shifter in an MZ interferometer, modulation can be executed with lower power consumption than a linear-type phase shifter although it is restricted to a certain wavelength.

Figure 5B:
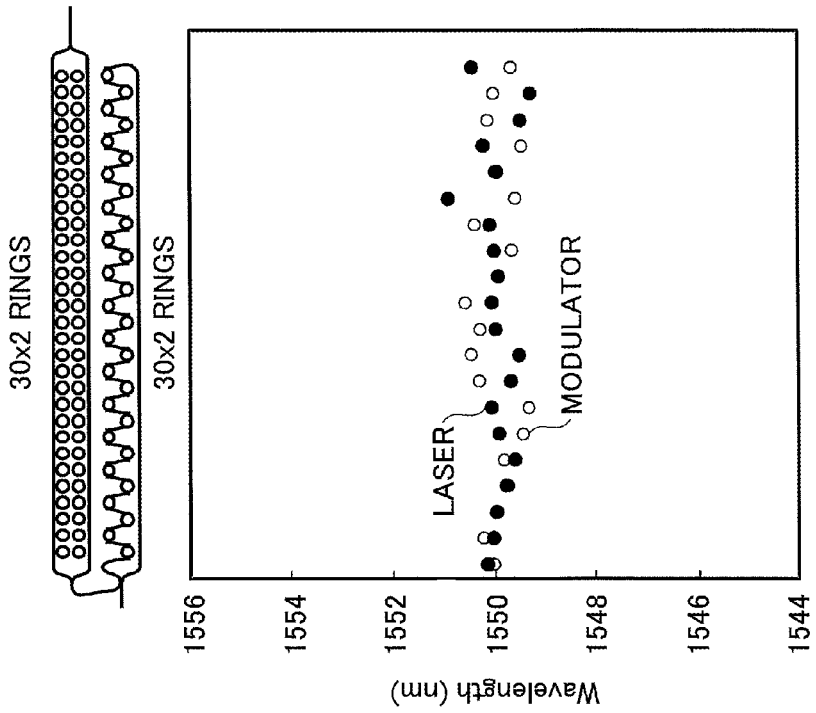
FIGS. 5A-5B are diagrams illustrating an effect of an optical semiconductor device of an embodiment of the present invention.
Figure 5A:
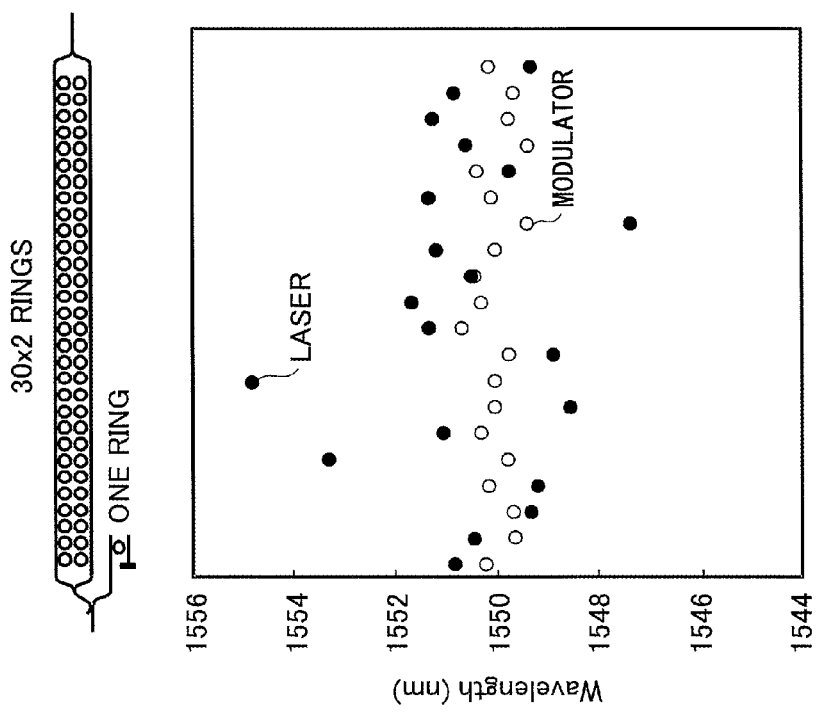

FIGS. 5A-5B are diagrams illustrating an effect of the optical semiconductor device 1 in FIG. 2A, which is compared with a conventional optical semiconductor device. A graph in FIG. 5A is a characteristic of a conventional configuration using a single ring-type resonator in a laser oscillator. The oscillation wavelength of the laser designated by black circles varies over a wide range. Manufacturing variations of the ring resonator directly result in variations of the resonance wavelength. In contrast to this, in a graph in FIG. 5B, a loop mirror in the present embodiment is used in the laser oscillator. In this case, not only variations of the oscillation wavelength of laser are suppressed, but also, the wavelength of laser oscillation is virtually equivalent to the resonance wavelength of the optical modulator. Note that variations of the resonance wavelength of the modulator are small in both graphs in FIGS. 5A-5B. This is because a cascaded ring phase shifter is used.

Thus, in the optical semiconductor device 1 in the present embodiment, wavelength variations are averaged in both the laser oscillator 10 and the optical modulator 20, so that a shift can be reduced between the modulation efficiency peak wavelength of the optical modulator and the oscillation wavelength of the laser oscillator.

Configurations of specific embodiments will be described below.

First Embodiment

FIGS. 6A-6B illustrate a plan view and a cross-sectional view, respectively, of an optical semiconductor device 1A according to a first embodiment. The optical semiconductor device 1A is manufactured by using an SOI (silicon-on-insulator) substrate. By processing a surface silicon layer of the SOI substrate, a loop waveguide 14 and ring resonators 13-1 to 13-N of a loop mirror 12, arms 24a-24b and ring resonators 23-1 to 23-2k of an optical resonator 20, and other waveguides 4 are formed. These waveguides are silicon thin line waveguides that have silicon (Si) as a core and $SiO_2$ layers 3 and 5 as claddings. An electrode 21 is formed on the $SiO_2$ layer 5 for voltage application to the optical modulator 20.

A part of the SiO2 layer 3 on the SOI substrate is removed to expose a silicon substrate 2. On the exposed silicon substrate 2, a gain medium 17 of the laser oscillator is disposed. The gain medium 17 is a semiconductor optical amplifier (SOA) chip 17 in which, for example, InGaAsP is formed on InP. An end surface of the SOA chip 17 has applied a high reflectance coating to form a high reflectance film 11, and the other end surface has applied an antireflection coating to form an antireflection film 16. Reflection is repeated between the high reflectance film 11 and the loop mirror 12.

The SOA chip 17 is attached by flip chip bonding using solder bumps 9. The waveguide 19 of the SOA chip 17 is coupled with the silicon thin line waveguides 4 by butt coupling. The gain medium 17 is not restricted to the SOA chip 17, but may be realized by attaching a III-V semiconductor on the Si thin line waveguides 4 by wafer fusion or bonding, and attaching an electrode for current injection.

FIG. 7 is a schematic view of the optical semiconductor device 1A in FIGS. 6A-6B. To broaden the transmission band of the ring resonators 13-1 to 13-N of the laser oscillator 10, a gap width d1 between the loop waveguide 14 of the loop mirror 12 and the ring resonator 13 is set smaller than a gap width d2 between the arm (waveguide) 24a or 24b of the optical modulator 20 and the ring resonator 23 (d2>>d1). Thus, the wavelength of laser oscillation of the laser oscillator 10 can be set in the neighborhood of the average value of the resonance wavelengths of the ring resonators 13, and virtually equivalent to the wavelength of the maximum modulation efficiency of the optical modulator 20.

Second Embodiment

Figure 8:
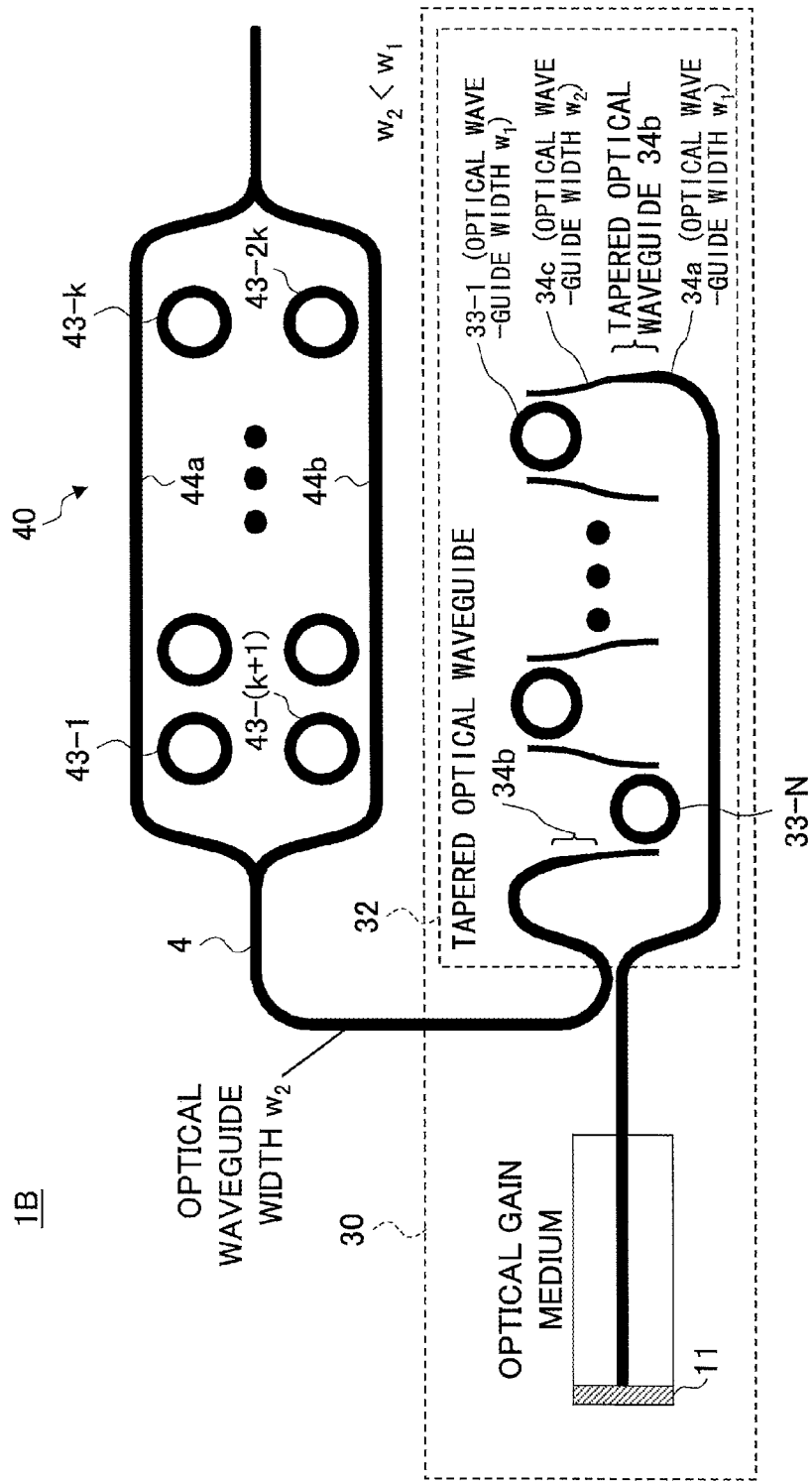
FIG. 8 is a schematic view illustrating an optical semiconductor device according to a second embodiment.

FIG. 8 is a schematic view of an optical semiconductor device 1B according to a second embodiment. The optical semiconductor device 1B includes a laser oscillator 30 and an optical modulator 40. In the second embodiment, another configuration is adopted to broaden the transmission band of ring resonators 33-1 to 33-N of a loop mirror 32.

The width w2 of a loop waveguide part 34c, which is an optical connection part adjacent to a ring resonator 33 of the loop mirror 32, is reduced compared to the width w1 of a loop waveguide part 34a (w2<w1). This broadens the expansion of the waveguide mode, makes the overlap with the ring waveguide greater, and strengthens the coupling from the loop waveguide part 34c to the ring resonator 33. This configuration can also broaden the transmission wavelength band of the ring resonators 33-1 to 33-N.

The loop waveguide part 34a having the greater width (w1) may be connected with the loop waveguide part 34c having the lesser width (w2) by a tapered optical waveguide part 34b. Also, the width of the waveguide parts 44a and 44b, the ring resonator 43-1 to 43-2k, and the other waveguides 4 of the optical modulator 40 may be set to the same width w2 as the loop waveguide part 34a.

Even if it is difficult to reduce the gap width between the loop waveguide part 34c and the ring resonator 33 due to a process restriction, a wide transmission wavelength band can be obtained when using the same gap width, by adopting the method of the second embodiment.

Third Embodiment

Figure 9:
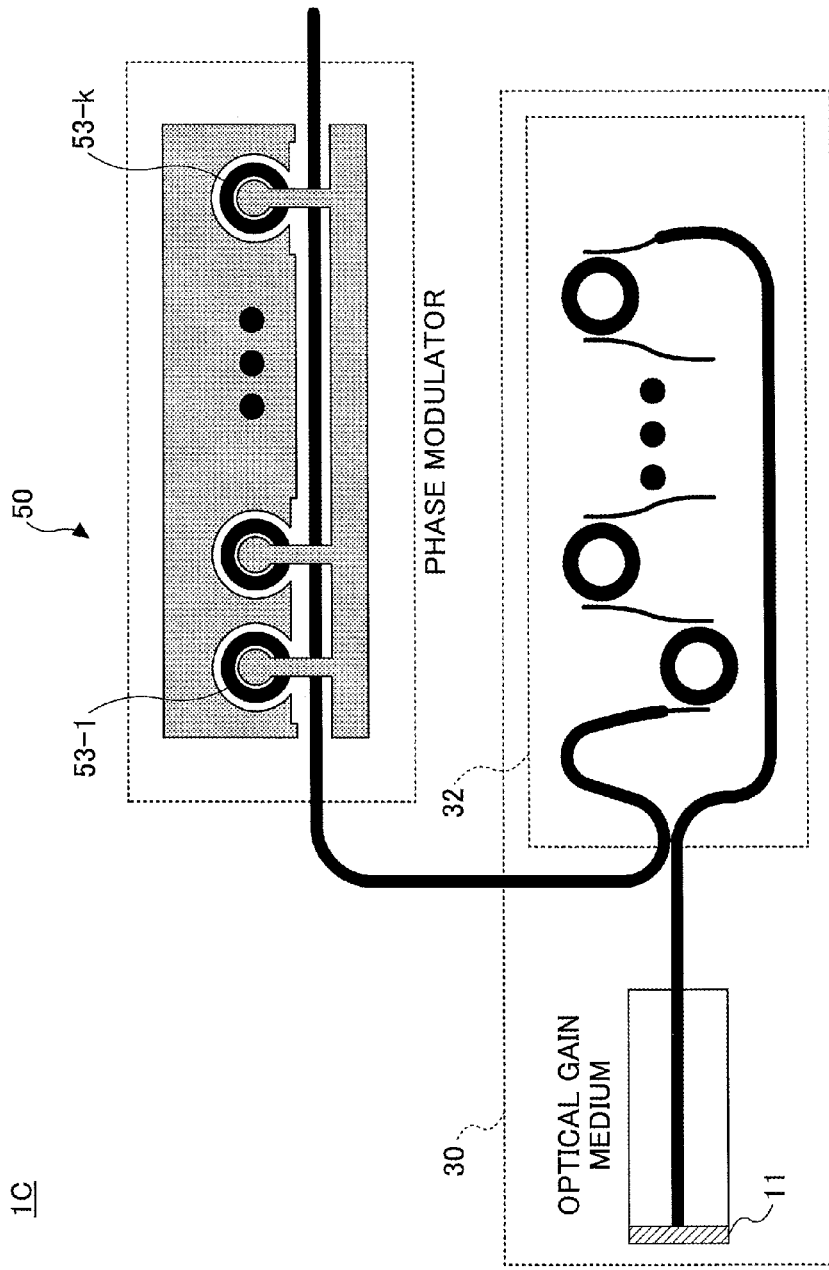
FIG. 9 is a schematic view illustrating an optical semiconductor device according to a third embodiment.

FIG. 9 is a schematic view of an optical semiconductor device 1C according to a third embodiment. The optical semiconductor device 1C includes a laser oscillator 30 and an optical modulator 50. In the third embodiment, a phase modulator 50 not having an MZ interferometer is used as an optical modulator 50 instead of a strength modulator. The effect of making the wavelength of laser oscillation equivalent to the wavelength of the maximum modulation efficiency of the optical modulator 50 is not specific to a strength modulator. The same effect is obtained with a configuration using the phase modulator 50 in which the wavelength of the maximum modulation efficiency is determined by the ring resonators 53-1 to 53N.

Although the laser oscillator 30 of the second embodiment is used in the example in FIG. 9, the laser oscillator 10 of the first embodiment may be combined with the phase modulator 50.

Fourth Embodiment

Figure 10:
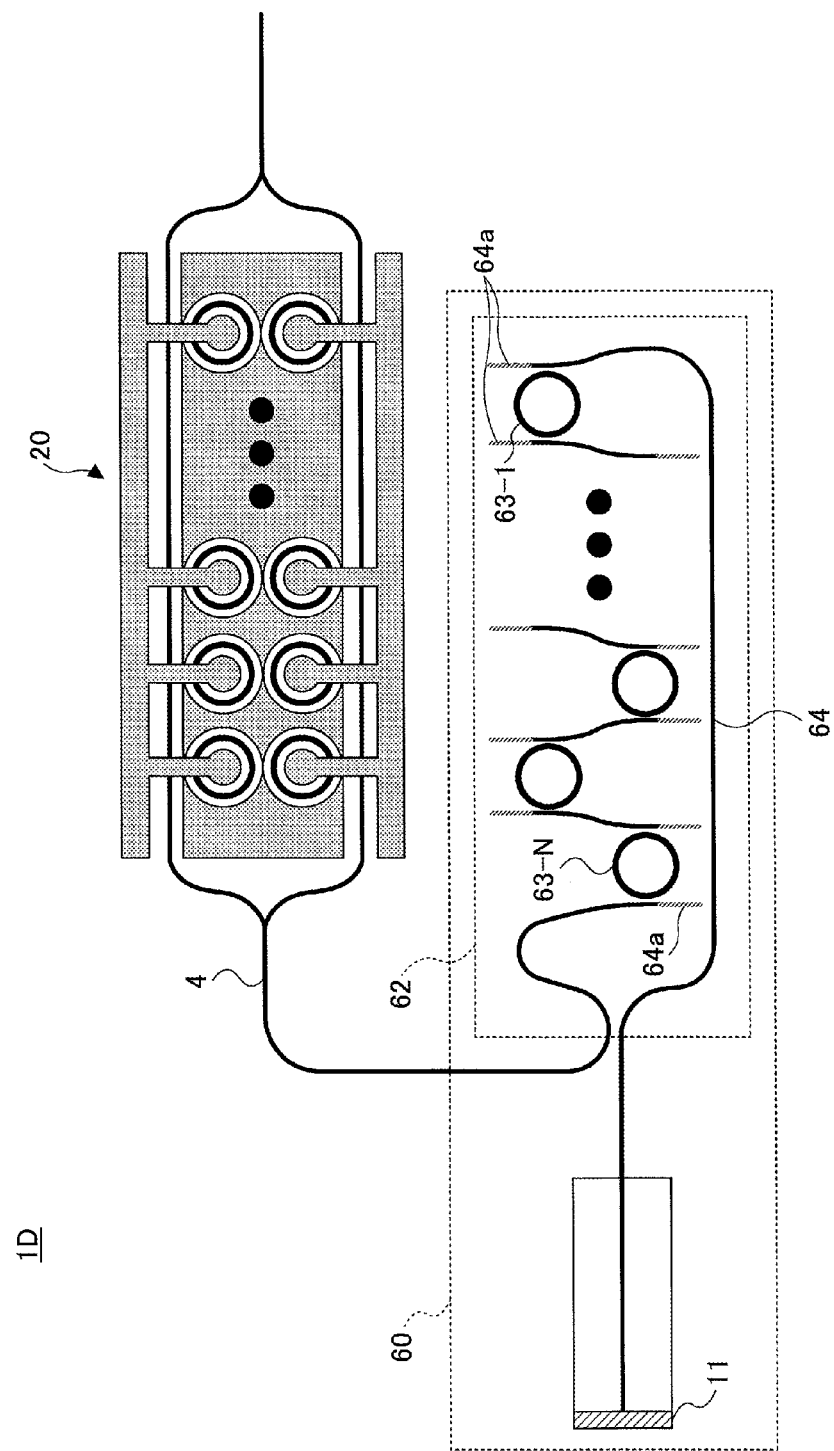
FIG. 10 is a schematic view illustrating an optical semiconductor device according to a fourth embodiment.

FIG. 10 is a schematic view of an optical semiconductor device 1D according to a fourth embodiment. The optical semiconductor device 1D includes a laser oscillator 60 and an optical modulator 20. In the fourth embodiment, a loop waveguide 64 of the loop mirror 62 is selectively doped with impurity at an optical connection part adjacent to a ring resonator 63, to form a light absorbing region 64a. The impurity may be a p-type impurity or an n-type impurity.

Light leaking from the waveguide 64 is absorbed in the region adjacent to the ring resonator 63, to suppress reflection at the waveguide terminal part (a region facing the ring resonator 63). By suppressing unnecessary reflection, the shape of the transmission spectrum of the laser oscillator 60 can be prevented from being disturbed, which is determined by the product of the transmission spectrums of the ring resonators 63-1 to 63-N connected in series.

Note that to broaden the transmission band of the ring resonators 63-1 to 63-N of the laser oscillator 60, a configuration may be adopted in which the gap width between the loop waveguide 64 and the ring resonator 63 is reduced as in the first embodiment. Alternatively, as in the second embodiment, a configuration may be adopted in which the width of the loop waveguide is reduced at a part adjacent to the ring resonator 63. By providing the light absorbing regions 64a at the waveguide part adjacent to the ring resonators 63, the whole transmission spectrum can be maintained to have a proper Gaussian curve in either of the configurations while broadening the transmission band width of each of the ring resonators 63.

Note that a phase modulator 50 of the third embodiment may be used instead of the MZ-type optical modulator 20. In either case, it is possible to make the oscillation wavelength of the laser oscillator 60 be stably equivalent to the wavelength of the maximum modulation efficiency of the optical modulator 20.

Fifth Embodiment

Figure 11:
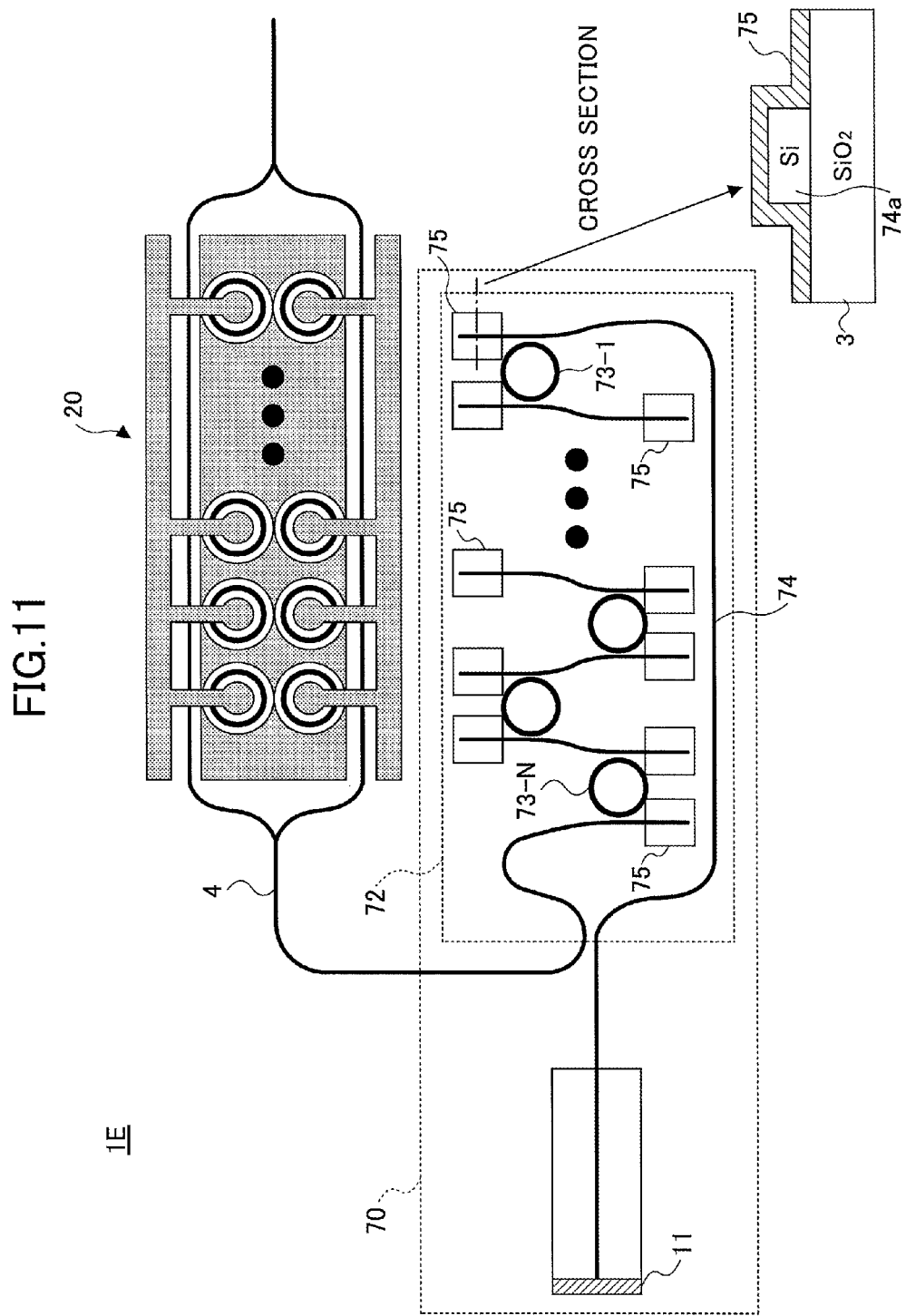
FIG. 11 is a schematic view illustrating an optical semiconductor device according to a fifth embodiment.

FIG. 11 is a schematic view of an optical semiconductor device 1E according to a fifth embodiment. The optical semiconductor device 1E includes a laser oscillator 70 and an optical modulator 20. In the fifth embodiment, an antireflection film 75 is formed on a silicon core 74a at a part adjacent to a ring resonator 73 in a loop waveguide 74 of a loop mirror 72. The antireflection film 75 may be formed of metal, metal oxide, resin having a low refractive index, or the like. The antireflection film 75 can prevent the shape of the transmission spectrum of the whole laser oscillator 70 from being disturbed.

The transmission band width of the laser oscillator 70 may be secured by a configuration having the gap width between the loop waveguide 74 and the ring resonator 73 reduced (the first embodiment), or a configuration having the optical waveguide width of the loop waveguide 74 reduced at a part adjacent to the ring resonator 73 (the second embodiment). A phase modulator 50 of the third embodiment may be used instead of the MZ-type optical modulator 20.

In either case, it is possible to make the oscillation wavelength of the laser oscillator 60 be stably equivalent to the wavelength of the maximum modulation efficiency of the optical modulator.

Sixth Embodiment

Figure 12:
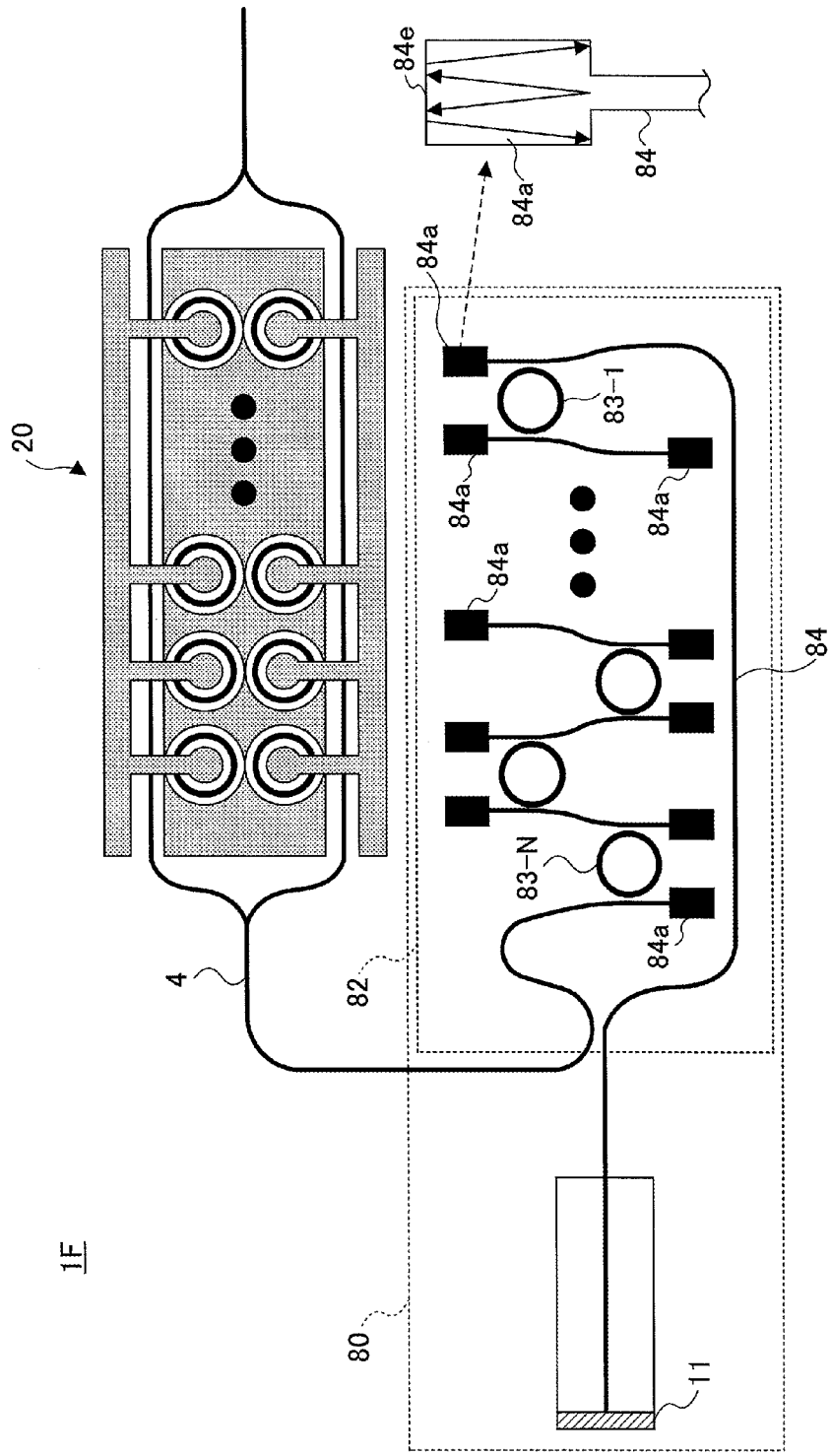
FIG. 12 is a schematic view illustrating an optical semiconductor device according to a sixth embodiment.

FIG. 12 is a schematic view of an optical semiconductor device 1F according to a sixth embodiment. The optical semiconductor device 1F includes a laser oscillator 80 and an optical modulator 20. In the sixth embodiment, an increased width part 84a is formed by increasing the width of a silicon core at a part adjacent to a ring resonator in a loop waveguide 84 of a loop mirror 82. By increasing the width of the silicon core, reflected light is prevented from being coupled with the original waveguide 84. Stable transmission of propagating light through the ring resonators 83 can prevent the shape of the transmission spectrum of the whole laser oscillator 80 from being disturbed.

The length of the increased width part 84a in the direction along the waveguide is set to a length so that reflected light from an edge 84e of the waveguide 84 can escape to the outside without focusing on a neck p of the increased width part 84a.

The transmission band width of the laser oscillator 80 may be secured by a configuration having the gap width between the loop waveguide 84 and the ring resonator 83 reduced (the first embodiment), or a configuration having the optical waveguide width of the loop waveguide 84 reduced at a part adjacent to the ring resonator 83 (the second embodiment). A phase modulator 50 of the third embodiment may be used instead of the MZ-type optical modulator 20.

In either case, it is possible to make the oscillation wavelength of the laser oscillator 80 be stably equivalent to the wavelength of the maximum modulation efficiency of the optical modulator 20.

Seventh Embodiment

Figure 13:
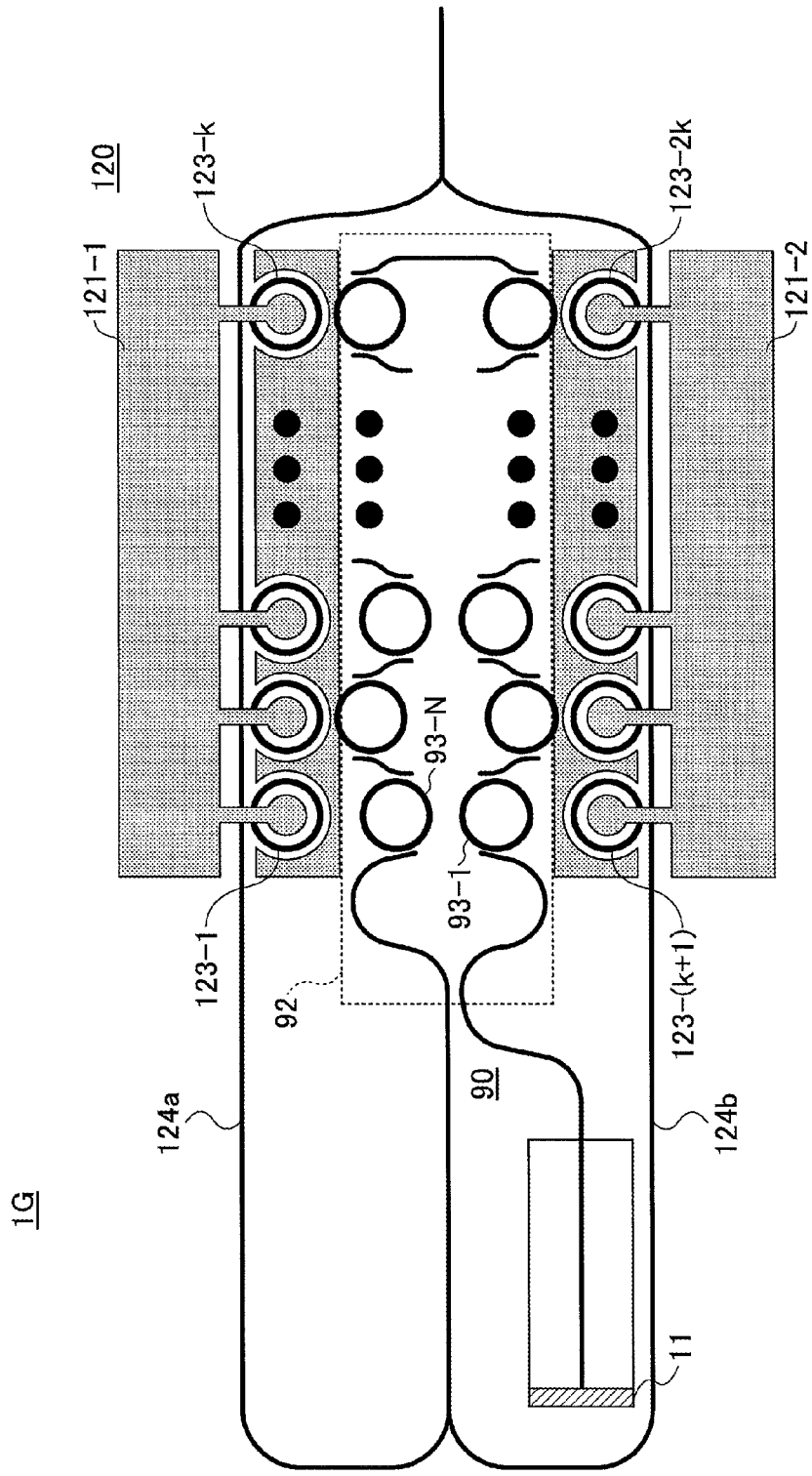
FIG. 13 is a schematic view illustrating an optical semiconductor device according to a seventh embodiment.

FIG. 13 is a schematic view of an optical semiconductor device 1G according to a seventh embodiment. The optical semiconductor device 1G includes a laser oscillator 90 and an optical modulator 120. In the seventh embodiment, a loop mirror 92 of the laser oscillator 90 is placed between two arms (waveguides) 124a and 124b of the optical modulator (MZ-type modulator) 120.

To make the wavelength of the optical modulator 120 be equivalent to the wavelength of the laser oscillator 90, the average of the resonance wavelengths of ring resonators 123-1 to 123-2k included in the optical modulator 120 is made equivalent to the average of the resonance wavelengths of ring resonators 93-1 to 93-N of the laser oscillator 90. In this case, it is effective to make the ring resonators 123-1 to 123-2k of the optical modulator 120 and the ring resonators 93-1 to 93-N of the laser oscillator 90 have closer positions. By making the ring resonators 93-1 to 93-N and the ring resonators 123-1 to 123-2k have closer positions, variations of the etching rate in a wafer surface and the thickness of the SiO2 film can be suppressed. Consequently, the center of variations of the resonance wavelength of the ring resonators 93-1 to 93-N of the laser oscillator 90 tends to be equivalent to the center of variations of the wavelength of the ring resonators 123-1 to 123-2k of the optical modulator 120.

With this configuration, a shift can be suppressed between the resonance wavelength of the laser oscillator 90 and the wavelength of the maximum modulation efficiency of the optical modulator 120.

Eighth Embodiment

Figure 14:
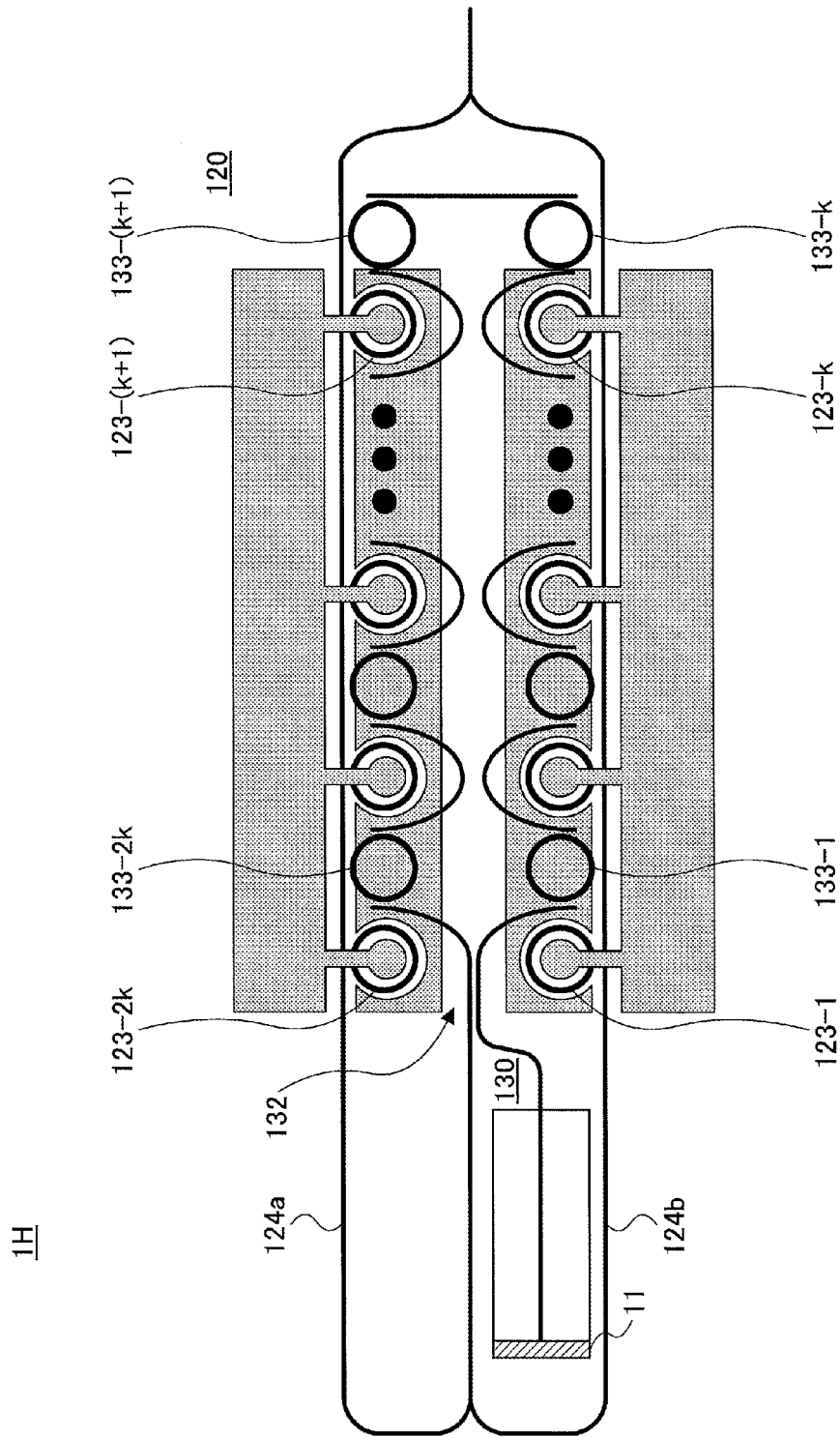
FIG. 14 is a schematic view illustrating an optical semiconductor device according to an eighth embodiment.

FIG. 14 is a schematic view of an optical semiconductor device 1H according to an eighth embodiment. The optical semiconductor device 1H includes a laser oscillator 130 and an optical modulator 120. In the eighth embodiment, the average oscillation wavelength of the laser oscillator 130 and the average wavelength of the optical modulator 120 are made further closer to each other. To achieve this, a loop mirror 132 is placed between two arms 124a and 124b of the optical modulator 120, ring resonators 123-1 to 123-2k of the optical modulator 120 and ring resonators 133-1 to 133-2k of the laser oscillator 130 are alternately placed.

With this configuration, a shift can be suppressed between the resonance wavelength of the laser oscillator 130 and the wavelength of the maximum modulation efficiency of the optical modulator 120 more effectively.

Ninth Embodiment

Figure 15:
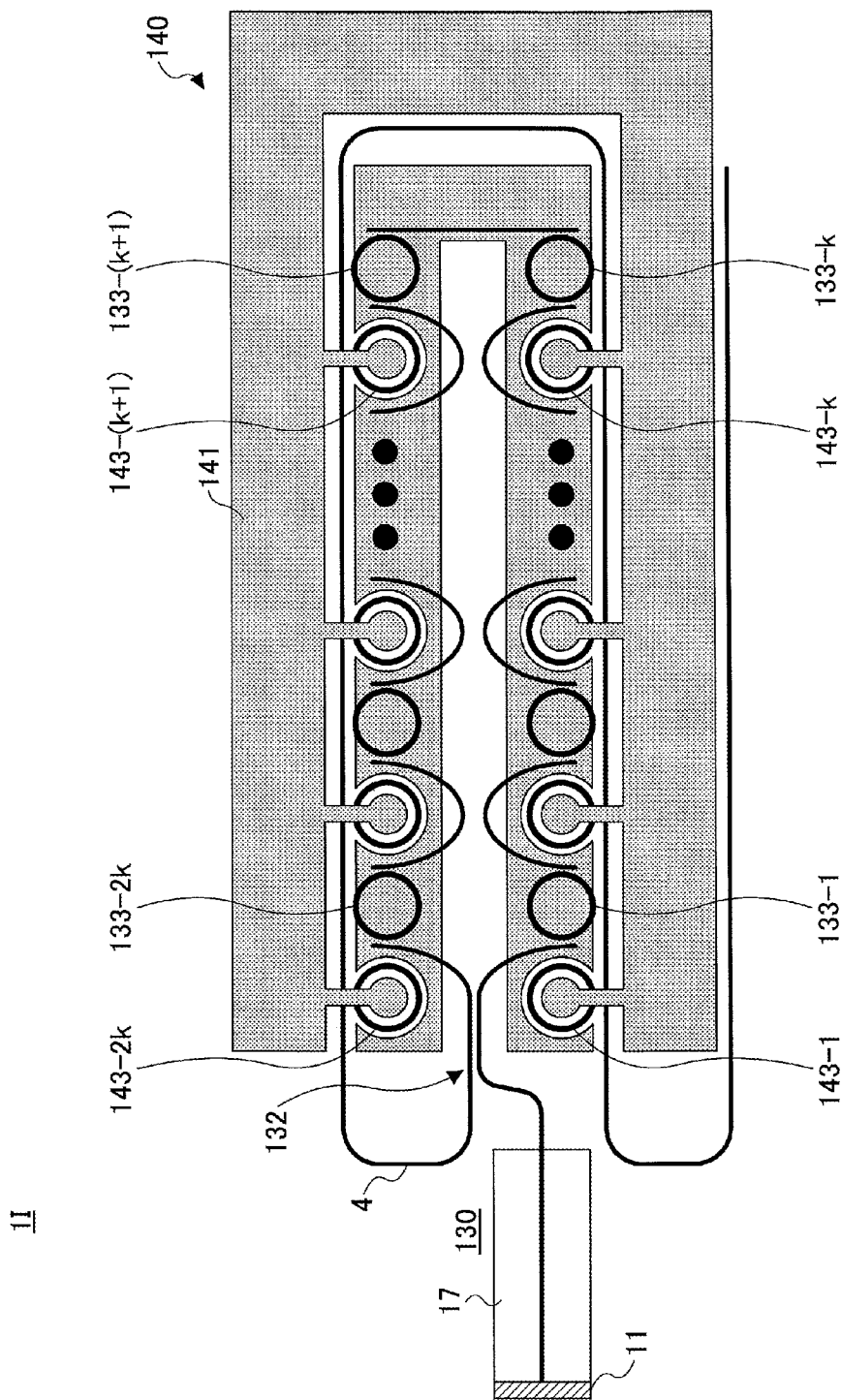
FIG. 15 is a schematic view illustrating an optical semiconductor device according to a ninth embodiment.

FIG. 15 is a schematic view of an optical semiconductor device 1I according to a ninth embodiment. The optical semiconductor device 1I includes a laser oscillator 130 and an optical modulator 140. A phase modulator 140 is used as an optical modulator 140. In this case, ring resonators 133-1 to 133-2k of the loop mirror 132 and ring resonators 143-1 to 143-2k of the optical modulator 140 can be alternately placed without having the whole laser oscillator 130 enclosed by waveguides 4 because an MZ interferometer is not used.

By not having the whole laser oscillator 130 enclosed by the waveguides 4, when using an SOA as a gain medium 17, multiple optical semiconductor devices (integrated structure of laser and modulator) can be configured on one chip by integrating multiple SOAs on one chip.

Tenth Embodiment

Figure 16:
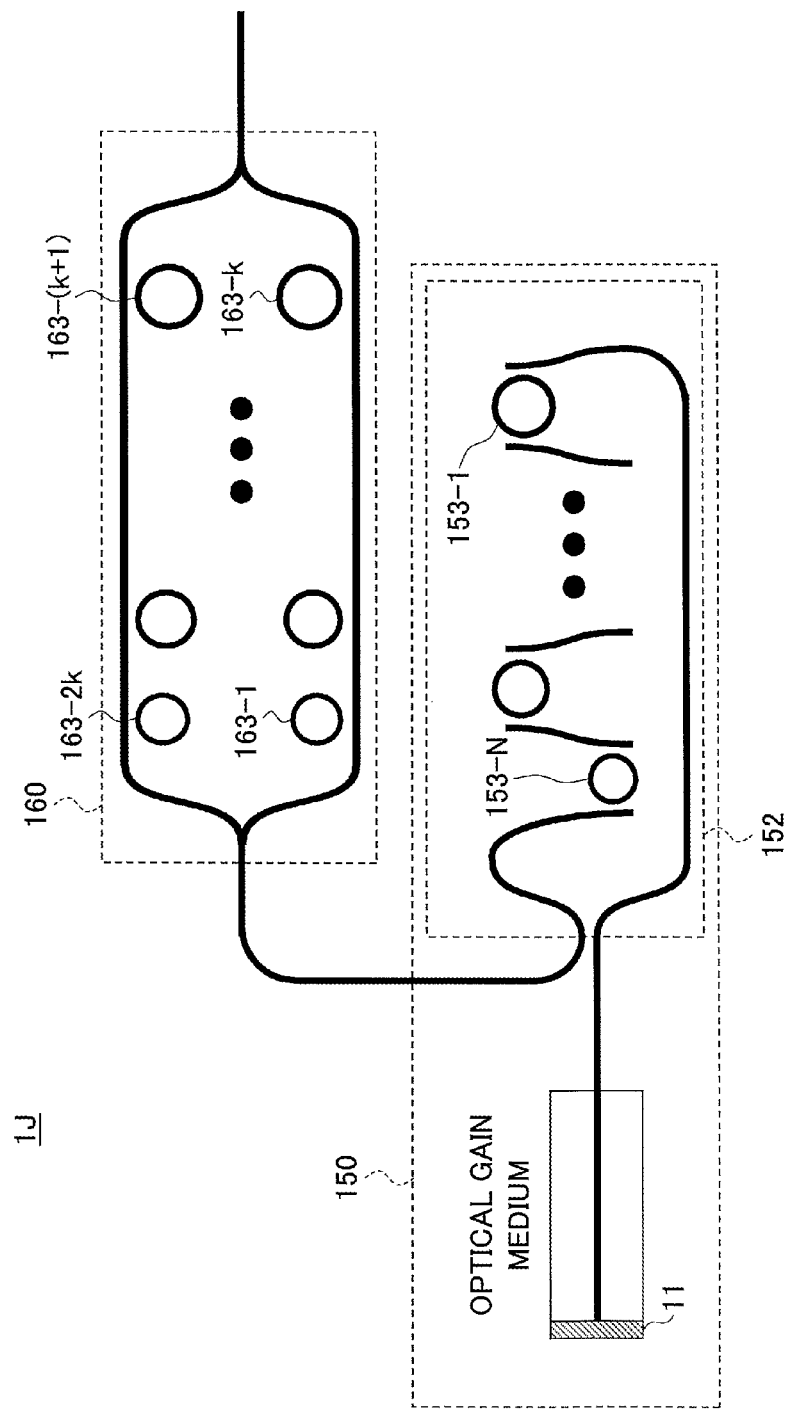
FIG. 16 is a schematic view illustrating an optical semiconductor device according to a tenth embodiment.

FIG. 16 is a schematic view of an optical semiconductor device 1J according to a tenth embodiment. The optical semiconductor device 1J includes a laser oscillator 150 and an optical modulator 160. In the tenth embodiment, ring resonators 153-1 to 153-N of the loop mirror 152 may not have the same circular optical path length. Namely, it is not necessary to configure all of the ring resonators 153-1 to 153-N with rings having the same size because it is sufficient to have the average resonance wavelength of the ring resonators 153-1 to 153-N of the laser oscillator 150 equivalent to the average resonance wavelength of ring resonators 163-1 to 163-2k of the optical modulator 160.

This is the same for the optical modulator 160. The ring resonators 163-1 to 163-N of the optical modulator do not necessarily have the same circular optical path length.

This configuration needs to satisfy a condition to have the average resonance wavelength of the ring resonators 153-1 to 153-N of the laser oscillator 150 equivalent to the average resonance wavelength of the ring resonators 163-1 to 163-2k of the optical modulator 160.

Eleventh Embodiment

Figure 17:
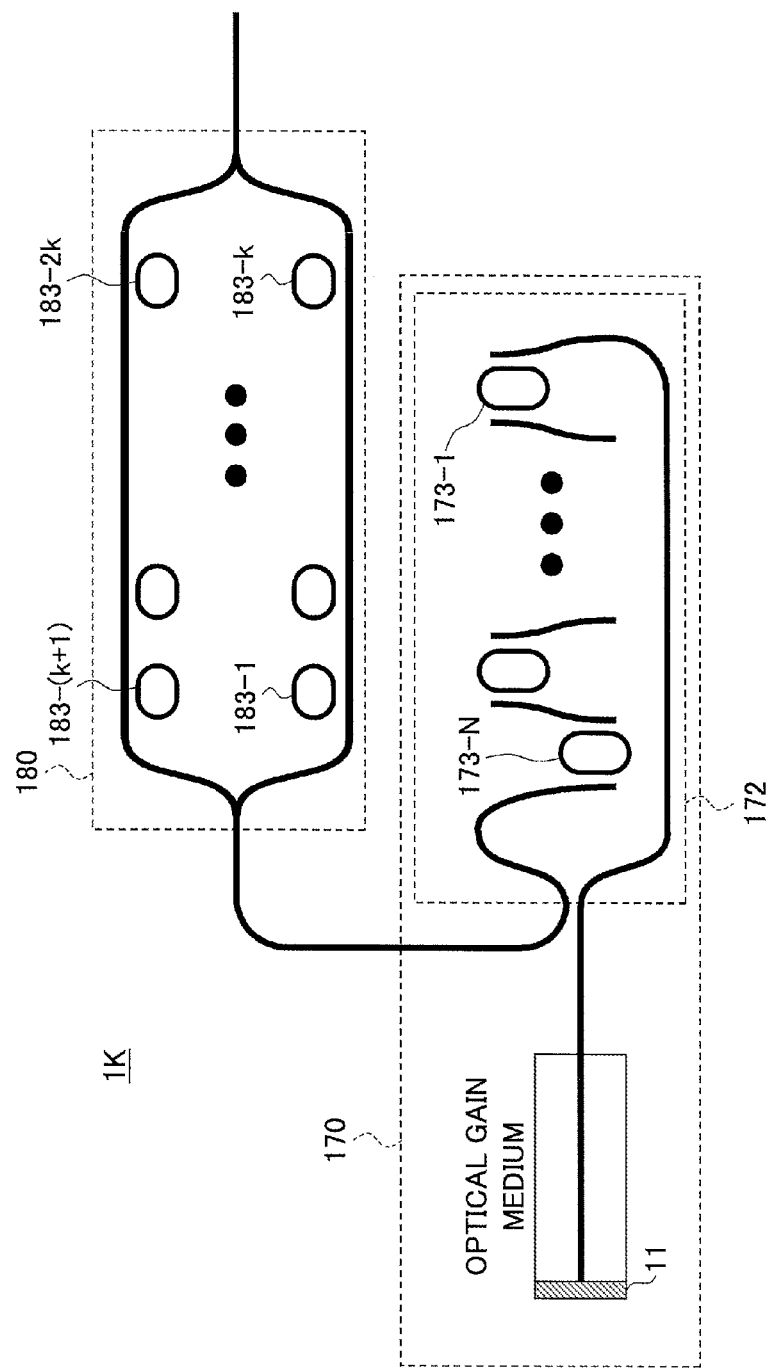
FIG. 17 is a schematic view illustrating an optical semiconductor device according to an eleventh embodiment.

FIG. 17 is a schematic view of an optical semiconductor device 1K according to an eleventh embodiment. The optical semiconductor device 1K includes a laser oscillator 170 and an optical modulator 180. In the eleventh embodiment, ring resonators 173-1 to 173-N of a loop mirror 172 do not necessarily have a circular shape. They may have a racetrack shape or another shape as long as it is a ring shape.

Similarly, ring resonators 183-1 to 183-2k of the optical modulator 180 do not necessarily have a circular shape. They may have a racetrack shape or another shape as long as it is a ring shape.

This configuration also needs to satisfy a condition to have the average resonance wavelength of the ring resonators 173-1 to 173-N of the laser oscillator 170 equivalent to the average resonance wavelength of the ring resonators 183-1 to 183-2k of the optical modulator 180.

When adopting a racetrack shape for the ring resonators 173-1 to 173-N and the ring resonators 183-1 to 183-2k, the length of the racetrack line part of each of the ring resonators 173-1 to 173-N of the laser oscillator 170 is set greater than the length of the racetrack line part of each of the ring resonators 183-1 to 183-2k of the optical modulator 180. This broadens the resonance wavelength band of the ring resonators 173-1 to 173-N of the laser oscillator 170.

With this configuration, the oscillation wavelength of the laser oscillator 170 can be made equivalent to the wavelength of the maximum modulation efficiency of the optical modulator 180.

Thus, a shift can be suppressed between the resonance wavelength of a laser oscillator and the wavelength of the maximum modulation efficiency of an optical modulator, which could be caused by manufacturing variations. Suppressing the shift improves and stabilizes the modulation efficiency. Also, an additional mechanism is not required to correct the shift, and the size can be reduced.

INDUSTRIAL USE FIELDS

The embodiments can be applied to a transmission module of an optical reception/transmission system.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. An optical semiconductor device comprising:
a laser oscillator on a semiconductor substrate; and
an optical modulator on the semiconductor substrate,
wherein the laser oscillator includes a pair of reflecting mirrors at least one of which is a loop mirror, and the loop mirror includes a loop waveguide and a plurality of first ring resonators serially inserted in the loop waveguide,
wherein the optical modulator includes a plurality of second ring resonators connected in cascade along a modulator waveguide,
wherein a transmission band width of the first ring resonator is set greater than a transmission band width of the second ring resonator.

2. The optical semiconductor device as claimed in claim 1, wherein a gap width between the loop waveguide and the first ring resonator is set less than a gap width between the modulator waveguide and the second ring resonator.

3. The optical semiconductor device as claimed in claim 1, wherein the loop waveguide includes a first waveguide part configured to be optically coupled with the first ring resonator by a first width, and a second waveguide part having a second width greater than the first width.

4. The optical semiconductor device as claimed in claim 3, wherein the loop waveguide further includes a third waveguide part configured to have a tapered shape and to connect the first waveguide part with the second waveguide part.

5. The optical semiconductor device as claimed in claim 1, wherein the loop waveguide has an impurity-doped region in a part of the loop waveguide adjacent to each of the first ring resonators.

6. The optical semiconductor device as claimed in claim 1, wherein the loop waveguide has an antireflection film covering the part of the loop waveguide at a part adjacent to each of the first ring resonators.

7. The optical semiconductor device as claimed in claim 1, wherein the loop waveguide has a reflection-suppressed region having a waveguide core broadened at a part facing each of the first ring resonators.

8. The optical semiconductor device as claimed in claim 1, wherein each of the first ring resonators and the second ring resonators has a racetrack shape including a line part,
wherein a length of the line part of the racetrack of the first ring resonators is greater than a length of the line part of the racetrack of the second ring resonators.

9. The optical semiconductor device as claimed in claim 1, wherein the optical modulator includes a Mach-Zehnder interferometer,
wherein the laser oscillator is placed in a region enclosed by two arms of the Mach-Zehnder interferometer.

10. The optical semiconductor device as claimed in claim 9, wherein the first ring resonators of the laser oscillator and the second ring resonators of the optical modulator are alternately arranged.

* * * * *